United States Patent
Lee et al.

(10) Patent No.: US 8,956,936 B2
(45) Date of Patent: Feb. 17, 2015

(54) METHOD OF FORMING GROUP III-V MATERIAL LAYER, SEMICONDUCTOR DEVICE INCLUDING THE GROUP III-V MATERIAL LAYER, AND METHOD OF MANUFACTURING THE SEMICONDUCTOR LAYER

(75) Inventors: Sang-moon Lee, Yongin-si (KR); Young-jin Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/568,555

(22) Filed: Aug. 7, 2012

(65) Prior Publication Data
US 2013/0105869 A1 May 2, 2013

(30) Foreign Application Priority Data
Oct. 31, 2011 (KR) .................. 10-2011-0112499

(51) Int. Cl.
*H01L 29/78* (2006.01)
*H01L 29/10* (2006.01)
*H01L 29/423* (2006.01)
*H01L 29/778* (2006.01)

(52) U.S. Cl.
CPC ...... *H01L 29/1033* (2013.01); *H01L 29/42376* (2013.01); *H01L 29/7787* (2013.01)
USPC ............... 438/197; 257/76; 257/88; 257/94; 257/288; 257/615

(58) Field of Classification Search
USPC ................... 438/197, 151, 199, 479
See application file for complete search history.

(56) References Cited

U.S. PATENT DOCUMENTS

| | | | |
|---|---|---|---|
| 5,393,680 A * | 2/1995 | Shikata ................... | 438/590 |
| 5,401,357 A * | 3/1995 | Okuhira et al. .......... | 438/694 |
| 6,242,327 B1 * | 6/2001 | Yokoyama et al. ....... | 438/507 |
| 2008/0070355 A1 | 3/2008 | Lochtefeld et al. | |
| 2008/0073667 A1 | 3/2008 | Lochtefeld et al. | |
| 2008/0099785 A1 | 5/2008 | Bai et al. | |
| 2009/0321882 A1 | 12/2009 | Park | |
| 2010/0012976 A1 | 1/2010 | Hydrick et al. | |
| 2010/0025683 A1 | 2/2010 | Cheng | |
| 2011/0241084 A1* | 10/2011 | Wu et al. ................. | 257/288 |

FOREIGN PATENT DOCUMENTS

| | | |
|---|---|---|
| JP | 2002-270516 A | 9/2002 |
| JP | 2005-347609 A | 12/2005 |
| JP | 2011-119617 A | 6/2011 |
| KR | 10-2008-0102028 | 11/2008 |
| KR | 10-2011-0037086 A | 4/2011 |

* cited by examiner

*Primary Examiner* — Chuong A Luu
*Assistant Examiner* — Rodolfo Fortich
(74) *Attorney, Agent, or Firm* — Harness, Dickey & Pierce, P.L.C.

(57) ABSTRACT

A method of forming a group III-V material layer, a semiconductor device including the group III-V material layer, and a method of manufacturing the semiconductor device. The semiconductor device includes a substrate; a group III-V channel layer formed on the substrate; a gate insulating layer formed on the group III-V channel layer; and a gate electrode and source and drain electrodes formed on the gate insulating layer, the source and drain electrodes having intervals from the gate electrode, wherein voids exist between a lower portion of the group III-V channel layer and an insulating layer. The group III-V channel layer may include a binary, ternary, or quaternary material.

24 Claims, 5 Drawing Sheets

METHOD OF FORMING GROUP III-V MATERIAL LAYER, SEMICONDUCTOR DEVICE INCLUDING THE GROUP III-V MATERIAL LAYER, AND METHOD OF MANUFACTURING THE SEMICONDUCTOR LAYER

CROSS-REFERENCE TO RELATED APPLICATIONS

This application claims the benefit of Korean Patent Application No. 10-2011-0112499, filed on Oct. 31, 2011, in the Korean Intellectual Property Office, the disclosure of which is incorporated herein in its entirety by reference.

BACKGROUND

1. Field

Example embodiments of inventive concepts relate to semiconductor devices and methods of manufacturing the semiconductor devices, for example, to methods of forming a group III-V material layer, semiconductor devices including the group III-V material layer, and methods of manufacturing the semiconductor devices including the group III-V material layer.

2. Description of the Related Art

As semiconductor devices are increasingly more highly integrated, the sizes of and the distances between elements of semiconductor devices are reduced. For example, in a silicon (Si)-based transistor, the sizes of and the distances between source, drain, and gate electrodes are ever decreasing. Since the size of the gate electrode is reduced, the length of a channel is also reduced and thus characteristics of the transistor often deteriorate due to the short channel effect. In order to cope with the reduction in size of the gate electrode, research is being conducted on technology involved in replacing channel materials with group III-V materials. However, due to a difference in crystal constant and thermal conductivity between a group III-V material and Si, a large number of defects are often formed on the interface between the two materials. As such, device applications are limited.

SUMMARY

Example embodiments of inventive concepts provide semiconductor devices including a group III-V compound semiconductor layer having no or greatly reduced defects.

In some example embodiments, methods of manufacturing the semiconductor devices are provided.

In some example embodiments, methods of forming a group III-V material layer used in the semiconductor devices are provided.

Additional example embodiments of inventive concepts will be set forth in part in the description which follows and, in part, will be apparent from the description, or may be learned by practice of the presented example embodiments.

According to some example embodiments, a semiconductor device may include a substrate, a group III-V channel layer may be formed on the substrate, a gate insulating layer may be formed on the group III-V channel layer and a gate electrode and source and drain electrodes may be formed on the gate insulating layer. The source and drain electrodes may be spaced at intervals from the gate electrode, wherein voids may exist between a lower portion of the group III-V channel layer and an insulating layer.

In some example embodiments, the group III-V channel layer may be of a material selected from a binary, a ternary, and a quaternary material.

In some example embodiments, the group III-V channel layer may include an upper portion having fewer defects than the lower portion.

In yet other example embodiments, the upper portion of the group III-V channel layer may be free of defects.

In some example embodiments, the insulating layer may be formed around the group III-V channel layer, may have a height less than the height of the group III-V channel layer, and may be partially spaced apart from the group III-V channel layer.

According to yet other example embodiments, the insulating layer may include sequentially stacked first and second insulating layers, and the voids may be defined by the space between the first insulating layer and the group III-V channel layer.

In some example embodiments, the first insulating layer may include silicon oxide, silicon nitride, or aluminum oxide.

In some example embodiments, the second insulating layer may include silicon oxide, silicon nitride, or aluminum oxide.

According to another example embodiment, a method of manufacturing a semiconductor device may include forming first and second insulating layers on a substrate, forming a hole in the second insulating, layer thereby exposing a portion of an upper surface of the first insulating layer, removing the exposed portion of the first insulating layer, thereby exposing the substrate and forming undercuts below the second insulating layer, selectively growing a group III-V material layer on the substrate, thereby filling the hole between the undercuts, removing a portion of the second insulating layer, thereby exposing portions of side surfaces of the group III-V material layer; forming a gate insulating layer, thereby covering an upper surface and the exposed side surfaces of the group III-V material layer, forming a gate electrode on the gate insulating layer and forming source and drain electrodes on the group III-V material layer spaced at intervals away from the gate electrode.

According to some example embodiments, the first and second insulating layers may be formed by using different materials selected from the group consisting of silicon oxide, silicon nitride, and aluminum oxide.

In some example embodiments, the group III-V material layer may be formed of a binary, ternary, or quaternary material including at least one group III element and at least one group V element.

In some example embodiments, a composite insulating layer including the first and second insulating layers, at a location where the group III-V material layer is formed may have an aspect ratio of about 0.1 to about 4.

In some example embodiments, the first insulating layer and the second insulating layer may have different thicknesses.

In some example embodiments, the first insulating layer may be thicker than the second insulating layer.

In some example embodiments, the selectively growing of the group III-V material layer on the substrate, thereby filling the hole between the undercuts may include growing the group III-V material layer on the substrate, thereby filling the hole between the undercuts and the group III-V material layer having a height greater than the height of the second insulating layer, and polishing the group III-V material layer, thereby lowering the height of the group III-V material layer to be the same as the height of the second insulating layer.

According to another example embodiment, a method of forming a group III-V material layer may include forming first and second insulating layers on a substrate forming a hole in the second insulating layer, thereby exposing a portion of an upper surface of the first insulating layer, removing the exposed portion of the first insulating layer, thereby exposing the substrate and forming undercuts below the second insulating layer and selectively growing a group III-V material layer on the substrate, thereby filling the hole between the undercuts.

In some example embodiments, the method may further include removing a portion of the second insulating layer, thereby exposing portions of side surfaces of the group III-V material layer.

In some example embodiments, the method may include, removing a portion of the second insulating layer, thereby exposing portions of side surfaces of the group III-V material layer.

In some example embodiments, the method may include first and second insulating layers formed of different materials selected form the group consisting of silicon oxide, silicon nitride and aluminum oxide.

In yet other example embodiments, the method may further include the group III-V material layer formed of one of a binary, a ternary and a quaternary material comprising at least one group III element and at least one group V element.

In still other example embodiments, the method may include a composite insulating layer comprising the first and second insulating layers at a location where the group III-V material layer is formed to have an aspect ratio of about 0.1 to about 4.

In other example embodiments, the selectively growing the group III-V material layer on the substrate, thereby filling the hole between the undercut may include: growing the group III-V material layer on the substrate, thereby filling the hole between the undercuts, the group III-V material layer having a height greater than the height of the second insulating layer and polishing the group III-V material layer, thereby lowering the height of the group III-V material layer to be the same height as the height of the second insulating layer.

In still other example embodiments, the method may include forming first insulating layer and the second insulating layer to be of different thicknesses.

In yet other example embodiments, the method may include forming first insulating layer to be thicker than the second insulating layer.

In still another example embodiment, a semiconductor device may include voids (or empty spaces) formed around a lower portion of a group III-V material, e.g., a group III-V compound semiconductor that is grown in a selected region of a silicon (Si) substrate. Due to the voids, when the group III-V material is grown, stress on the group III-V material caused by differences in lattice constant and thermal conductivity between the group III-V material and the Si substrate is reduced. As such, since defects formed when the group III-V material is grown are restricted to a lower portion of the group III-V material, an upper portion of the group III-V material may be grown as a high-quality material including few defects. If the above group III-V material is used as a channel or a group III-V compound semiconductor substrate, a semiconductor device having improved electrical or operational characteristics in comparison to a Si-based semiconductor device may be obtained.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF EXAMPLE EMBODIMENTS

Figure 1:
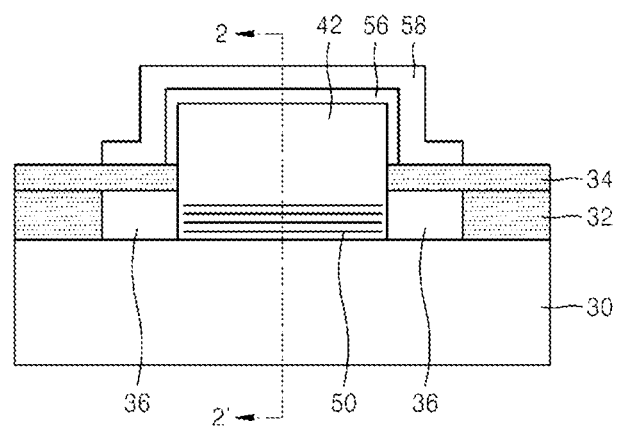
FIG. 1 is a cross-sectional view of a semiconductor device including a group III-V material layer as a channel layer, according to example embodiments of the inventive concepts.

Example embodiments will now be described more fully with reference to the accompanying drawings. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements throughout, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The attached drawings for illustrating example embodiments of inventive concepts are referred to in order to gain a sufficient understanding of inventive concepts and the merits thereof. Hereinafter, inventive concepts will be described in detail by explaining embodiments of inventive concepts with reference to the attached drawings. Like reference numerals in the drawings denote like elements.

A method of forming a group III-V material layer will be described below wherever a method of manufacturing a semiconductor device is described.

FIG. 1 is a cross-sectional view of a semiconductor device including a group III-V material layer 42 as a channel layer, according to an example embodiment of the inventive concepts.

Referring to FIG. 1, the group III-V material layer 42 is disposed on a region of a substrate 30. The substrate 30 may be, for example, a silicon (Si) substrate. The group III-V material layer 42 may be used as a channel layer of a transistor. The group III-V material layer 42 may be, for example, a group III-V compound semiconductor layer. The group III-V compound semiconductor layer may include, for example, a binary, ternary, or quaternary material. The binary material may be, for example, GaAs, GaP, InP, InAs, GaSb, InSb, AlP, AlAs, or AlSb. The ternary or quaternary material may include, for example, one or two group III elements selected from the group consisting of indium (In), gallium (Ga), and aluminum (Al), and at least one group V element selected from the group consisting of arsenic (As), phosphorus (P), and antimony (Sb). First and second insulating layers 32 and 34 may be sequentially stacked at two sides of the group III-V material layer 42. An upper surface of the second insulating layer 34 formed on the first insulating layer 32 has a height less than the height of an upper surface of the group III-V material layer 42. The second insulating layer 34 contacts side surfaces of the group III-V material layer 42. However, the first insulating layer 32 does not contact the group III-V material layer 42. That is, the first insulating layer 32 is spaced apart from the group III-V material layer 42. As such, voids (or empty spaces) 36 exist between the first insulating layer 32 and the group III-V material layer 42. The volume of the voids 36 may be adjusted during the manufacture of the semiconductor device. Due to the voids 36, when the group III-V material layer 42 is grown, stress on the group III-V material layer 42 caused by differences in lattice constant and thermal conductivity between the group III-V material layer 42 and the substrate 30 may be reduced. Also, due to the voids 36, defects 50 formed when the group III-V material layer 42 is grown may be restricted to a lower portion of the group III-V material layer 42. The first and second insulating layers 32 and 34 may be formed using materials having different etch selectivities. The first insulating layer 32 may be formed of, an oxide or a nitride, for example, silicon oxide, aluminum oxide, or silicon nitride. The second insulating layer 34 may be formed of an oxide or a nitride, for example, silicon oxide, aluminum oxide, or silicon nitride.

Although the defects 50 are representatively illustrated as horizontal lines in FIG. 1, the defects 50 may exist as diagonal lines or non-straight lines. A protruding portion of the group III-V material layer 42 having a height greater than the height of the second insulating layer 34 does not include the defects 50. A gate insulating layer 56 is on upper and side surfaces of the protruding portion of the group III-V material layer 42. The gate insulating layer 56 may be formed of a dielectric, for example, silicon oxide. A gate electrode 58 may be disposed on the gate insulating layer 56. The gate electrode 58 may cover the entire protruding portion of the group III-V material layer 42. Accordingly, the semiconductor device illustrated in FIG. 1 is a fin-type transistor.

Figure 2:
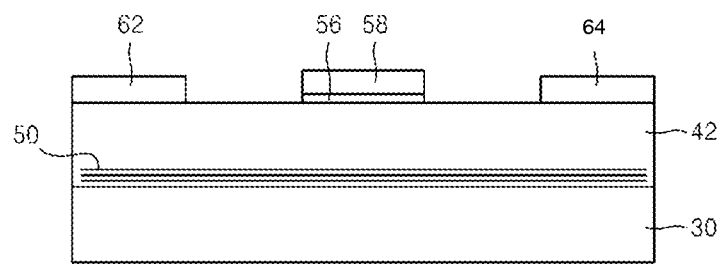
FIG. 2 is a cross-sectional view cut along a line 2-2' illustrated in FIG. 1.

FIG. 2 is a cross-sectional view cut along a line 2-2' illustrated in FIG. 1.

Referring to FIG. 2, source and drain electrodes 62 and 64 are formed with an interval therebetween on the group III-V material layer 42. The gate insulating layer 56 is formed on the group III-V material layer 42 between the source electrode 62 and drain electrode 64, and the gate electrode 58 is on the gate insulating layer 56. The source and drain electrodes 62 and 64 are spaced apart from each other. The gate insulating layer 56 and the gate electrode 58 are between the source and drain electrodes 62 and 64.

FIGS. 3 through 9 are cross-sectional views for describing a method of manufacturing the semiconductor device illustrated in FIGS. 1 and 2, according to example embodiments of the inventive concepts.

Figure 3:
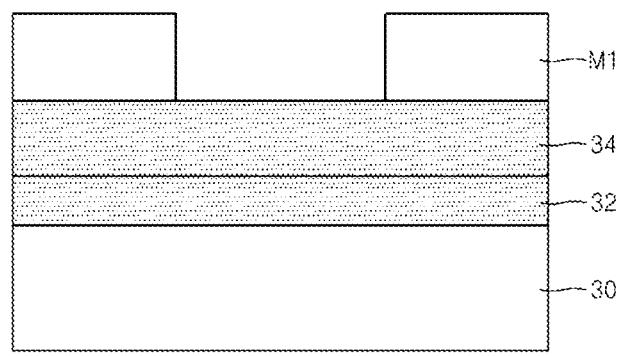
FIGS. 3 through 9 are cross-sectional views illustrating an example method of manufacturing the semiconductor device illustrated in FIGS. 1 and 2, according to example embodiments of the inventive concepts.
Figure 4:
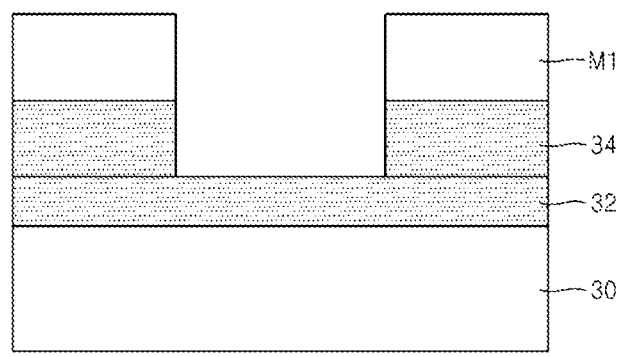

Referring to FIG. 3, the first insulating layer 32 is formed on the substrate 30. The first insulating layer 32 may be formed of, for example, silicon oxide. The second insulating layer 34 is formed on the first insulating layer 32. The second insulating layer 34 may be formed using an insulating material having a different etch selectivity from the first insulating layer 32. The second insulating layer 34 may be formed of, for example, silicon nitride. A mask M1 for defining a partial region of the second insulating layer 34 is formed on the second insulating layer 34. As such, a region for forming the group III-V material layer 42 in a subsequent process may be defined. The mask M1 may be, for example, a photoresist pattern. After the mask M1 is formed, an exposed portion of the second insulating layer 34 is removed. The exposed portion of the second insulating layer 34 may be removed until the first insulating layer 32 is exposed, by using, for example, an anisotropic dry etching method. If the exposed portion of the second insulating layer 34 is removed, as illustrated in FIG. 4, the first insulating layer 32 under the exposed portion of the second insulating layer 34 is exposed.

Figure 5:
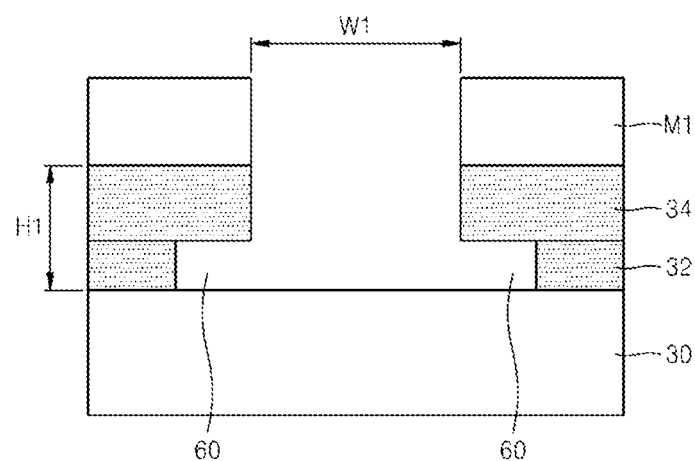

In FIG. 5, the exposed first insulating layer 32 is partially etched through the opening in the second insulating layer 34, and undercuts 60 are formed. An insulating layer including the first and second insulating layers 32 and 34 may have an aspect ratio (H1/W1) equal to or greater than about 0.1, for example, about 0.1 to about 4.

Figure 6:
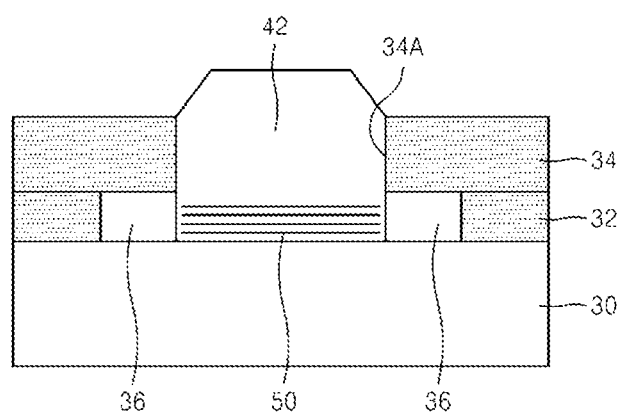

Then, referring to FIG. 6, the group III-V material layer 42 is formed on an exposed portion of an upper surface of the substrate 30. The group III-V material layer 42 is formed through a hole (an opening) 34A formed in the second insulating layer 34 and has a height greater than the height of the second insulating layer 34. The group III-V material layer 42 may be grown by using an epitaxy method. In an example using an epitaxy method, a source gas of the group III-V material layer 42 reaches the substrate 30 through the hole 34A formed in the second insulating layer 34. Accordingly, an area for forming the group III-V material layer 42 on the exposed portion of the upper surface of the substrate 30 is restricted by the hole 34A formed in the second insulating layer 34. As such, the group III-V material layer 42 may be formed on only a selected area of the upper surface of the substrate 30, thereby achieving selective area growth (SAG). Due to the SAG, the group III-V material layer 42 is formed on the substrate 30 under the hole 34A formed in the second insulating layer 34, e.g., substantially only between the undercuts 60 illustrated in FIG. 5, and is generally not formed on the undercuts 60. As such, the voids 36 are formed between the group III-V material layer 42 and the first insulating layer 32. Due to the voids 36, stress on the group III-V material layer 42 between the group III-V material layer 42 and the substrate 30, when the group III-V material layer 42 is grown, may be reduced. As such, the defects 50 formed in the group III-V material layer 42 are generally restricted to a lower portion of the group III-V material layer 42 and are generally not formed in an upper portion of the group III-V material layer 42. Accordingly, the upper portion of the group III-V material layer 42 includes few to no defects 50. The group III-V material layer 42 may be formed using the materials described above in relation to FIG. 1.

Figure 7:
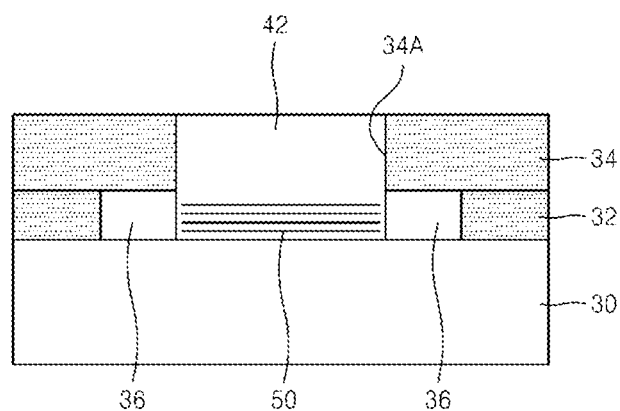

After the group III-V material layer 42 is formed, the group III-V material layer 42 may be polished in order to reduce the height of the group III-V material layer. In the case of polishing, the polishing is performed until an upper surface of the group III-V material layer 42 substantially has the same height as the upper surface of the second insulating layer 34, as illustrated in FIG. 7. The group III-V material layer 42 may be polished by using, for example, a chemical mechanical polishing (CMP) method, or other appropriate methods of accomplishing a similar result.

Figure 8:
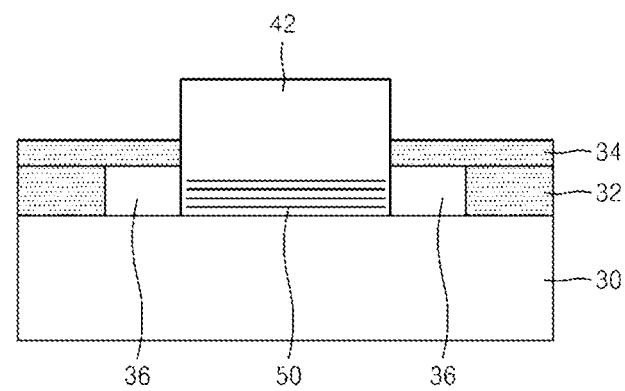

Then, in a result of FIG. 7, a portion of the second insulating layer 34 around the group III-V material layer 42 is removed so that the upper portion of the group III-V material layer 42 protrudes, as illustrated in FIG. 8.

Figure 9:
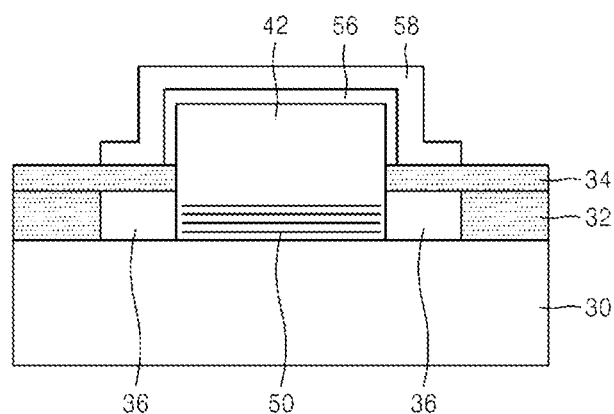

Then, as illustrated in FIG. 9, the gate insulating layer 56 is formed on upper and side surfaces of the protruding portion of the group III-V material layer 42. As shown in FIG. 2, the gate insulating layer 56 is formed on only a partial region of the group III-V material layer 42 used as a channel layer. The gate insulating layer 56 may be formed of, for example, silicon oxide. After that, the gate electrode 58 is formed on the gate insulating layer 56. When the gate electrode 58 is formed, as illustrated in FIG. 2, the source and drain electrodes 62 and 64 may also be formed, spaced apart at intervals from the gate insulating layer 56.

As such, a fin-type transistor using the group III-V material layer 42 as a channel layer is formed.

After the group III-V material layer 42 is polished and before a portion of the second insulating layer 34 is removed, that is, in the result of FIG. 7, another semiconductor device, e.g., a solar cell, may be formed on the group III-V material layer 42 by using the group III-V material layer 42 as a substrate.

It should be understood that the example embodiments of inventive concepts described herein should be considered in a descriptive sense only and not for purposes of limitation. Descriptions of features or aspects within each embodiment should typically be considered as available for other similar features or aspects in other embodiments.

What is claimed is:
1. A semiconductor device, comprising:
a substrate;
an insulating layer on a top surface of the substrate;
a group III-V channel layer on the substrate;
a gate insulating layer on the group III-V channel layer; and
a gate electrode on the gate insulating layer;
a source electrode; and
a drain electrode, the source and drain electrodes spaced at intervals from the gate electrode,
wherein voids exist between a lower portion of the group III-V channel layer and the insulating layer, and
wherein the group III-V channel layer includes an upper portion, the upper portion having fewer defects than the lower portion of the group III-V channel layer.
2. The semiconductor device of claim 1, wherein the group III-V channel layer is of a material selected from one of, a binary, a ternary, and a quaternary material.
3. The semiconductor device of claim 1, wherein the upper portion of the group III-V channel layer is free of defects.
4. The semiconductor device of claim 1, wherein the insulating layer is formed around the group III-V channel layer, has a height less than the height of the group III-V channel layer, and is partially spaced apart from the group III-V channel layer.
5. The semiconductor device of claim 4, wherein the insulating layer comprises sequentially stacked first and second insulating layers, and wherein the voids are defined by the space between the first insulating layer and the group III-V channel layer.
6. The semiconductor device of claim 5, wherein the first insulating layer selected from silicon oxide, silicon nitride, and aluminum oxide.
7. The semiconductor device of claim 5, wherein the second insulating layer is of a material selected from silicon oxide, silicon nitride, and aluminum oxide.
8. The semiconductor device of claim 5, wherein the first and second insulating layers have different thickness.
9. The semiconductor device of claim 8, wherein the first insulating layer is thicker than the second insulating layer.
10. A method of manufacturing a semiconductor device, the method comprising:

forming first and second insulating layers on a substrate;
forming a hole in the second insulating layer, so as to expose a portion of an upper surface of the first insulating layer;
removing the exposed portion of the first insulating layer, so as to expose the substrate and forming undercuts below the second insulating layer;
selectively growing a group III-V material layer on the substrate, so as to fill the hole between the undercuts;
removing a portion of the second insulating layer, so as to expose portions of side surfaces of the group III-V material layer;
forming a gate insulating layer so as to cover an upper surface and the exposed side surfaces of the group III-V material layer;
forming a gate electrode on the gate insulating layer; and
forming source and drain electrodes on the group III-V material layer spaced at intervals from the gate electrode,
wherein the group III-V material layer includes an upper portion, the upper portion having fewer defects than a lower portion of the group III-V material layer.

11. The method of claim 10, wherein the first and second insulating layers are formed by using different materials selected from the group consisting of silicon oxide, silicon nitride, and aluminum oxide.

12. The method of claim 10, wherein the group III-V material layer is formed of a binary, ternary, or quaternary material comprising at least one group III element and at least one group V element.

13. The method of claim 10, wherein a composite insulating layer comprising the first and second insulating layers, at a location where the group III-V material layer is formed, has an aspect ratio of about 0.1 to about 4.

14. The method of claim 13, wherein the first insulating layer and the second insulating layer have different thickness.

15. The method of claim 14, wherein the first insulating layer is thicker than the second insulating layer.

16. The method of claim 10, wherein the selectively growing of the group III-V material layer on the substrate so as to fill the hole between the undercuts comprises:
growing the group III-V material layer on the substrate so as to fill the hole between the undercuts and the group III-V material layer having a height greater than the height of the second insulating layer; and
polishing the group III-V material layer so as to lower the height of the group III-V material layer to be the same as the height of the second insulating layer.

17. A method of forming a group III-V material layer comprising:
forming first and second insulating layers on a substrate;
forming a hole in the second insulating layer, so as to expose a portion of an upper surface of the first insulating layer;
removing the exposed portion of the first insulating layer so as to expose the substrate and forming undercuts below the second insulating layer; and
selectively growing a group III-V material layer on the substrate so as to fill the hole between the undercuts,
wherein the group III-V material layer includes an upper portion, the upper portion having fewer defects than a lower portion of the group III-V material layer.

18. The method of claim 17, further comprising removing a portion of the second insulating layer so as to expose portions of side surfaces of the group III-V material layer.

19. The method of claim 17, wherein the first and second insulating layers are formed of different materials selected from the group consisting of silicon oxide, silicon nitride, and aluminum oxide.

20. The method of claim 17, wherein the group III-V material layer is formed of one of a binary, a ternary, and a quaternary material comprising at least one group III element and at least one group V element.

21. The method of claim 17, wherein a composite insulating layer comprising the first and second insulating layers, at a location where the group III-V material layer is formed, has an aspect ratio of about 0.1 to about 4.

22. The method of claim 17, wherein the selectively growing of the group III-V material layer on the substrate, thereby filling the hole between the undercuts comprises:
growing the group III-V material layer on the substrate so as to fill the hole between the undercuts, the group III-V material layer having a height greater than the height of the second insulating layer; and
polishing the group III-V material layer so as to lower the height of the group III-V material layer to be the same as the height of the second insulating layer.

23. The method of claim 17, wherein the first insulating layer and the second insulating layer have different thickness.

24. The method of claim 23, wherein the first insulating layer is thicker than the second insulating layer.

* * * * *